(12) United States Patent
Albou et al.

(10) Patent No.: US 11,005,013 B2
(45) Date of Patent: May 11, 2021

(54) LIGHTING AND/OR SIGNALING DEVICE FOR MOTOR VEHICLE

(71) Applicant: VALEO VISION, Bobigny (FR)

(72) Inventors: Pierre Albou, Bobigny (FR); Marine Courcier, Bobigny (FR); Vanesa Sanchez, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 15/641,911

(22) Filed: Jul. 5, 2017

(65) Prior Publication Data

US 2018/0010754 A1 Jan. 11, 2018

(30) Foreign Application Priority Data

Jul. 5, 2016 (FR) ...................................... 16 56386

(51) Int. Cl.
*F21S 41/25* (2018.01)
*F21S 41/14* (2018.01)
(Continued)

(52) U.S. Cl.
CPC .............. *H01L 33/58* (2013.01); *F21S 41/14* (2018.01); *F21S 41/141* (2018.01); *F21S 41/25* (2018.01); *F21S 41/43* (2018.01); *H01L 27/156* (2013.01); *H01L 33/06* (2013.01); *H01L 33/32* (2013.01); *H01L 33/46* (2013.01); *H01L 33/56* (2013.01); *F21Y 2105/16* (2016.08); *F21Y 2115/00* (2016.08); *H01L 33/08* (2013.01); *H01L 33/24* (2013.01); *H01L 33/507* (2013.01); *H01L 33/60* (2013.01)

(58) Field of Classification Search
CPC ........ B69Q 1/04; F21S 41/143; F21S 41/153; F21K 9/62; F21Y 2105/16
See application file for complete search history.

(56) References Cited

U.S. PATENT DOCUMENTS 7,828,456 B2 * 11/2010 Boyer ....................... F21V 7/04
  362/153.1
8,227,969 B2 * 7/2012 Yamaguchi .......... G02B 3/0037
  313/116
(Continued)

FOREIGN PATENT DOCUMENTS

| EP | 2 587 134 A1 | 5/2013 |
| FR | 3 031 238 A1 | 7/2016 |
| WO | 2016/084672 A1 | 6/2016 |

OTHER PUBLICATIONS

French Preliminary Search Report dated Feb. 22, 2017 in French Application 16 56386 filed on Jul. 5, 2016 (with English Translation of Categories Cited Documents).

(Continued)

*Primary Examiner* — Jong-Suk (James) Lee
*Assistant Examiner* — Eric T Eide
(74) *Attorney, Agent, or Firm* — Oblon, McClelland, Maier & Neustadt, L.L.P.

(57) ABSTRACT

A semiconductor light source that includes a substrate B and a plurality of semiconductor light-emitting rods extending respectively from the substrate, and a plurality of separating walls also extending from the substrate. The separating walls are arranged between the rods in such a way as to define groups of rods, and such that at least two separating walls have a different height.

20 Claims, 5 Drawing Sheets

(51) Int. Cl.

| | | |
|---|---|---|
| *F21S 41/141* | (2018.01) |
| *F21S 41/43* | (2018.01) |
| *F21Y 105/16* | (2016.01) |
| *F21Y 115/00* | (2016.01) |
| *H01L 33/24* | (2010.01) |
| *H01L 33/58* | (2010.01) |
| *H01L 27/15* | (2006.01) |
| *H01L 33/06* | (2010.01) |
| *H01L 33/32* | (2010.01) |
| *H01L 33/46* | (2010.01) |
| *H01L 33/56* | (2010.01) |
| *H01L 33/08* | (2010.01) |
| *H01L 33/50* | (2010.01) |
| *H01L 33/60* | (2010.01) |

(56) References Cited

U.S. PATENT DOCUMENTS

| | | | | |
|---|---|---|---|---|
| 8,403,529 B2 * | 3/2013 | Harbers | ............... | F21V 7/0008 362/241 |
| 8,430,523 B1 * | 4/2013 | Smith | ............... | F21V 29/004 362/235 |
| 9,541,255 B2 * | 1/2017 | Sferra | ............... | F21V 7/0066 |
| 2010/0108998 A1 * | 5/2010 | Verjans | ............... | F21V 11/02 257/40 |
| 2010/0295071 A1 * | 11/2010 | Tsai | ............... | G02B 19/0028 257/91 |
| 2013/0107525 A1 * | 5/2013 | Woodgate | ............... | F21K 9/00 362/237 |
| 2013/0294076 A1 | 11/2013 | Grau | | |
| 2014/0166974 A1 | 6/2014 | Yoo et al. | | |
| 2014/0264395 A1 * | 9/2014 | Lee | ............... | H01L 27/15 257/88 |
| 2015/0085523 A1 * | 3/2015 | Gurtl | ............... | F21S 41/143 362/607 |
| 2015/0207038 A1 * | 7/2015 | Hwang | ............... | H01L 33/46 257/88 |
| 2015/0377453 A1 * | 12/2015 | Ji | ............... | F21S 41/24 362/607 |
| 2016/0163922 A1 | 6/2016 | Yoo et al. | | |
| 2017/0373118 A1 * | 12/2017 | Hugon | ............... | G02F 1/133603 |

OTHER PUBLICATIONS

Office Action issued in Japanese Application No. 2017-131448, dated Jan. 26, 2021, along with an English translation.

\* cited by examiner

FIG.1
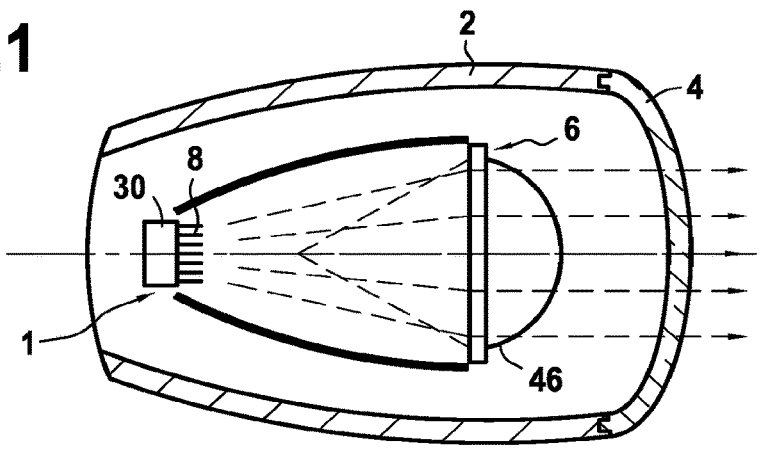
FIG.2
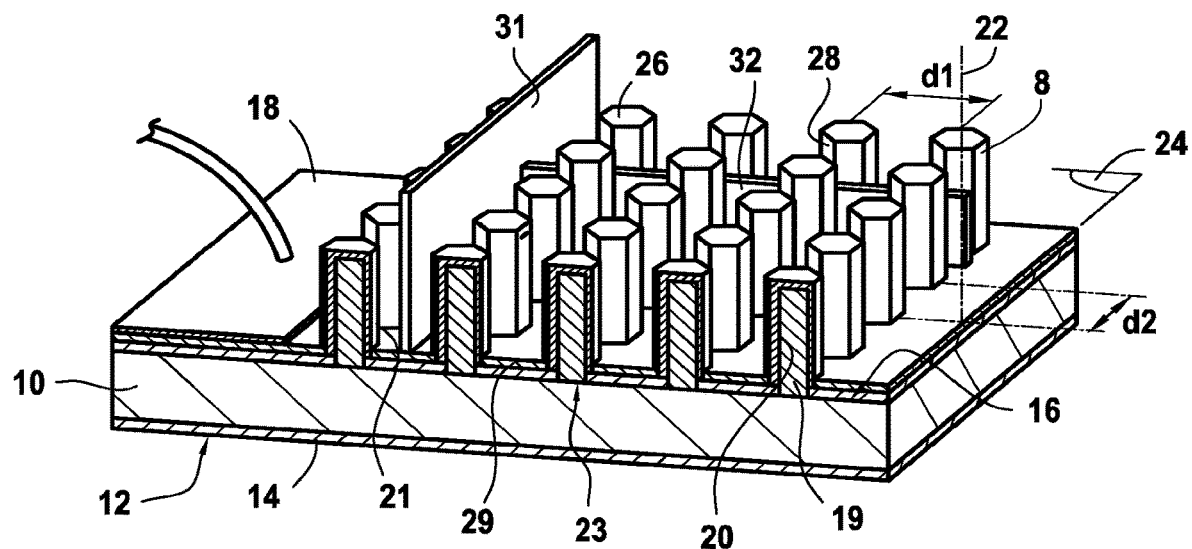
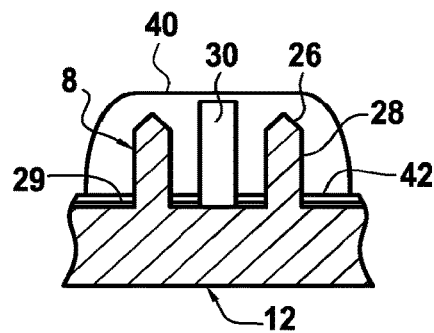
FIG.3

LIGHTING AND/OR SIGNALING DEVICE FOR MOTOR VEHICLE

The invention concerns the field of lighting and/or signaling, in particular for motor vehicles. It relates more particularly to a light source and a lighting device, for lighting and/or signaling in a motor vehicle, which comprises a light source of this kind and an optic for shaping light rays emitted by this source.

A motor vehicle is equipped with headlights, or headlamps, intended to illuminate the road in front of the vehicle, at night or in the event of reduced light. These headlamps may generally be used in two lighting modes: a first "high beam" mode and a second "low beam" mode. The "high beam" mode enables the road far in front of the vehicle to be brightly lit. The "low beam" mode provides a more limited lighting of the road, but nonetheless offers good visibility without dazzling other road users.

So as not to dazzle other road users, a low beam, specific to the "low beam" mode, is provided, which low beam has a right-hand-side cut-off forming a substantially horizontal upper edge, situated mainly below the horizon line. This cut-off may have a stepped shape so as to have a bottom cut-off in the zone in which other road users are situated in theory, and a top part enabling, in this low-beam context, the road scene outside of this zone to be lit a little further. These cut-offs, which generate a stark contrast between the lit zone and the rest of the road scene, may in particular be produced by means of a shield arranged in the path of the rays, between the light source and the shaping optic.

Other types of cut-off beam are generated by using modern headlights, and there are beams, for example, in which the cut-off is vertical, in contrast to the low beam outlined above in which the cut-off is horizontal. By way of example, reference may be made to a matrix beam, in which the beam is segmented into vertical strips generated by a plurality of light-emitting diodes, respectively, the turning-off of a particular source to create a dark band in the beam being controlled depending on the detection of a vehicle in the road scene.

In each of these cases, whether it be so that the low beam is regulatory or so that the driver has perfect visibility outside of the dark zone in a matrix beam, the cut-off must have a sufficient contrast, that is to say, in other words, that the cut-off must be very sharp. However, in certain zones of the road scene illuminated by the lighting beam of the vehicle, it may be preferable to have more blurred cut-offs in order to have a very uniform beam. By way of example, very distinct contrast lines in the beam or at the edge of the beam may generate visual distractions for the driver by projecting onto obstacles such as trees, tunnels or signposts. Thus, for the purpose of providing a lighting beam that is effective and pleasant for the driver, the requirements in terms of the sharpness of the cut-offs may differ from one zone to another of one and the same beam.

One may therefore be prompted to look for a variable sharpness in the cut-offs, for example with a sharp cut-off in the axis of the path of the vehicle, that is to say the driving direction, and a more blurred cut-off at the sides.

Patent FR2986621 discloses a technical solution in which the lens is modified so as to have patterns that are perpendicular with respect to one another and that make it possible to have a different sharpness between the horizontal cut-off and the vertical cut-offs. It is understood that applying patterns to the lens is difficult to perform and therefore expensive.

The present invention falls within this context, as the light sources used in these headlights are increasingly commonly made up of light-emitting diodes, in particular to gain advantages in terms of bulk and of autonomy in comparison with conventional light sources. The use of light-emitting diodes in lighting and/or signaling modules has furthermore enabled market players (motor vehicle manufacturers and lighting and/or signaling device designers) to add a creative touch when designing these devices, in particular through the use of an ever-increasing number of these light-emitting diodes to produce optical effects. One of the drawbacks of using these diodes is their cost price.

In this twin context, the invention aims to provide a lighting device that makes it possible to control the sharpness of the various cut-offs formed in the light beam that said lighting device plays a part in projecting, falling within an economic context in which the cost prices of the light sources are kept as low as possible, while keeping or increasing the lighting capacities of these light sources, and in particular while improving the management of the luminous intensity at the beam cut-offs.

One subject of the invention is a semiconductor light source, and a lighting device comprising such a source and an optic for shaping the light rays emitted by this source. In particular, the light source that is the subject of the invention comprises a carrier, which may in particular be a substrate, a plurality of light-emitting elements, extending respectively from the substrate, these light-emitting elements in particular being able to be which may in particular be semiconductor light-emitting rods of submillimeter size. The light source furthermore includes a plurality of separating walls, also extending from the carrier while being arranged between said light-emitting elements in such a way as to define groups of these elements, and such that at least two separating walls have a different height.

The term "height", whether this be separating walls in this case or light-emitting elements hereinafter, is used to define the dimension in which these elements extend from the carrier, substantially perpendicularly to the upper surface of the latter, that is to say the surface from which the separating walls and the light-emitting elements emerge.

Moreover, the term "shaping optic" is understood to mean that at least one of the rays emitted by the light source is deflected by the shaping optic, that is to say that the direction of entry of this at least one light ray into the shaping optic is different from the direction of exit of the light ray from the shaping optic. The shaping optic comprises at least one optical element, such as one or more lenses, one or more reflectors, one or more light guides, or a combination of these possibilities.

The shaping optic may comprise an optic for projecting the light emitted by the semiconductor light source. This projecting optic creates a real and possibly anamorphic image of a part of the device, for example the source itself or a shield, or of an intermediate image of the source, at a very large (finite or infinite) distance in comparison with the dimensions of the device (of a ratio of the order of at least 30, preferably 100) of the device. This projecting optic may consist of one or more reflectors, or else of one or more lenses, or one or more light guides, or indeed of a combination of these possibilities.

The shaping optic may be arranged in such a way that the light source is not situated on the object focal plane of the shaping optic.

This makes it possible, in particular, to project an image that appears continuous, using direct imaging, without having to provide a projection system that has to modify the source image before being projected. This is particularly beneficial for simplifying the proposed device, in particular when one or more separating walls are arranged projecting from the substrate so as to play a part in the optical pixelation of the projected regulatory beam.

The at least two walls of different height advantageously define one and the same group of rods. By this concept of walls defining one and the same group of rods, it is understood that what is under consideration is at least two walls each forming a wall delineating one and the same first group of rods that is independent from a second group of rods. This is true whether these two walls be substantially parallel or whether they be contiguous, and regardless of the number of walls that play a part in delineating this first group of rods.

Thus, a technology is applied to the motor vehicle sector that consists in producing the light-emitting zone using a plurality of light-emitting rods that are grown on a substrate, so as to produce a three-dimensional topology. It is understood that this three-dimensional topology has the advantage of multiplying the light-emitting surface with respect to the light-emitting diodes known hitherto in the motor vehicle sector, namely substantially planar diodes. It is therefore possible to provide a very luminous white light at a reduced cost price.

It may be provided that the light-emitting rods are able to be activated selectively, and that at least two groups of light-emitting rods of the light source are arranged so as to be turned on selectively, it being understood that what is meant by this is that one or more rods of the light source may be controlled so as to vary their luminous intensity. A system for controlling the separate turning-on of these rods is provided, it being understood that what is meant mainly by this is that the rods may be simultaneously or non-simultaneously turned on or turned off separately from one or another.

It is possible to produce a pixelated light that may change depending on traffic conditions by turning off and turning on any of the rods that make up the light source. In other words, applying a semiconductor light source, having light-emitting rods of submillimeter size, to a motor vehicle headlight enables a simplified installation of adaptive lighting systems, in which it may be desired to form matrix beams, part of which may be turned off so as not to dazzle another road user, for example.

The presence of separating walls in the direct vicinity of the light-emitting rods makes it possible to produce a cut-off in the beam by blocking some of the rays emitted by these rods, and it is understood that the sharpness of the cut-off relates to the height of the corresponding separating wall and to the position of the top of these walls with respect to the focal point of the projecting optic: the closer the free end face of the separating wall, the distance of which from the carrier defines the height of this wall, to the object focal surface of the shaping optic, the sharper the cut-off.

The light-emitting rods and the separating walls may extend from one and the same substrate, and they may in particular be formed directly on this substrate. It may be provided that the substrate is silicon-based or silicon carbide-based. It is understood that the substrate is silicon-based as long as it consists primarily of silicon, for example to at least 50%, and in practice to around 99%.

According to a first series of features that are specific to the formation of the separating walls and to the arrangement of these separating walls on the substrate, it may be provided that, with each feature being able to be taken alone or in combination with the others:

the two separating walls, defining one and the same group of rods and having different heights, extend substantially perpendicularly with respect to one another;

a first series of separating walls, substantially parallel to one another, extends from the substrate in a first direction and has an average height greater than the average height of a second series of separating walls, substantially parallel to one another and extending in a second direction, in particular substantially perpendicularly to the first direction. In particular in the case of an application of a light source with light-emitting rods arranged in a two-dimensional matrix, it is possible to provide a first series of separating walls, in which each of the separating walls is perpendicular to the separating walls of the second series;

at least the separating walls of the first or of the second series have a progressive height, decreasing from the center of the source toward at least one edge of the source;

at least one separating wall has a trapezoidal cross section, or else at least one separating wall has a face facing a rod that has a parabolic profile, the focal point of the parabola advantageously being centered on said rod.

According to a second series of features that are specific to the formation of the light-emitting rods and to the arrangement of these light-emitting rods on the substrate, it may be provided that, with each feature being able to be taken alone or in combination with the others:

each rod has a cylindrical general shape, in particular with a polygonal cross section; it may be provided that each rod has the same general shape, and in particular a hexagonal shape;

the rods are each delineated by an end face and by a circumferential wall that extends along a longitudinal axis of the rod defining its height, the light being emitted at least from the circumferential wall; this light could also be emitted via the end face;

each rod may have an end face that is substantially perpendicular to the circumferential wall, and, in various variants, it may be provided that this end face is substantially planar or curved or pointed at its center;

the rods are arranged in a two-dimensional matrix, whether this matrix be regular, with a constant spacing between two successive rods of a given alignment, or whether the rods be arranged in quincunx;

the height of a rod is between 1 and 10 micrometers;

the largest dimension of the end face is smaller than 2 micrometers;

the distance separating two immediately adjacent rods is equal to 2 micrometers at least and equal to 100 micrometers at most.

According to other features, it may be provided that the semiconductor light source comprising a plurality of light-emitting rods of submillimeter size furthermore includes a layer of polymeric material forming an encapsulant in which the rods and the separating walls are at least partially embedded; such an encapsulant is deposited on the substrate, covering the rods and the separating walls, and it is advantageous for the encapsulant to extend at least as far as to cover the highest rod. This polymeric material may be silicone-based, it being understood that the polymeric material is silicone-based as long as it consists primarily of silicone, for example to at least 50%, and in practice to around 99%. The layer of polymeric material may comprise a phosphor or a plurality of phosphors that are excited by the light generated by at least one of the plurality of rods. A phosphor, or light converter, is understood to mean the presence of at least one luminescent material designed to absorb at least part of at least one excitation light emitted by a light source and to convert at least part of said absorbed excitation light into a light emission having a wavelength that is different from that of the excitation light. This phosphor, or this plurality of phosphors, may be at least partially embedded in the polymer, or else arranged on the surface of the layer of polymeric material. By way of example, the rays emitted by the rods may have a wavelength corresponding to the color blue, and some of them are capable of being converted into rays having a wavelength corresponding to the color yellow, such that the additive synthesis of the non-converted blue and of the yellow forms a white beam at the output of the layer of polymeric material. To this end, it is possible to use, alone or in combination, the following luminescent materials, for example: $Y_3Al_5O_{12}$: $Ce^{3+}$ (YAG), $(Sr,Ba)_2SiO_4$: $Eu^{2+}$, $Ca_x(Si,Al)_{12}(O,N)_{16}$:$Eu^{2+}$.

According to various particular features of the invention that are specific to the device including, on the one hand, a light source as outlined above and, on the other hand, a shaping optic, it may be provided that:

- the different height of at least two separating walls defining one and the same group of rods makes it possible to achieve a light beam having cut-offs of variable sharpness;
- a first series of separating walls extends substantially vertically facing the shaping optic, whereas a second series of separating walls extends substantially horizontally facing the shaping optic, the first series, as before, having a greater average height than the average height of the second series.
- the encapsulant covers the entirety of the separating walls, the focal surface of the shaping optic being coincident with an end surface of the encapsulant;
- the encapsulant partially covers one or more separating walls, the focal surface of the shaping optic being adjusted to the end face of the highest separating wall;
- the lighting device comprises a light source that generates light rays that form at least one regulatory light beam for a motor vehicle. The term "regulatory beam" is understood to mean a beam that complies with one of the photometry charts illustrated in the figures.
- The device may be used both in a front headlight and in a tail light of a motor vehicle.

Other features and advantages of the present invention will become more clearly apparent in light of the description and the drawings, among which:

FIG. 1 is a cross-sectional view of a lighting and/or signaling device according to the invention, illustrating light rays emitted by a semiconductor light source according to the invention in the direction of a shaping optic;

FIG. 2 is a schematic, perspective depiction of the semiconductor light source from FIG. 1, showing a row of light-emitting rods in cross section, and showing an example of the production of two separating walls of different heights defining a first group of rods;

FIG. 3 is a cross-sectional view of a detail of one particular embodiment of a semiconductor light source according to the invention, in which two light-emitting rods and one separating wall project from a substrate, said light-emitting rods and the wall being encapsulated in a protective layer;

Figure 11:
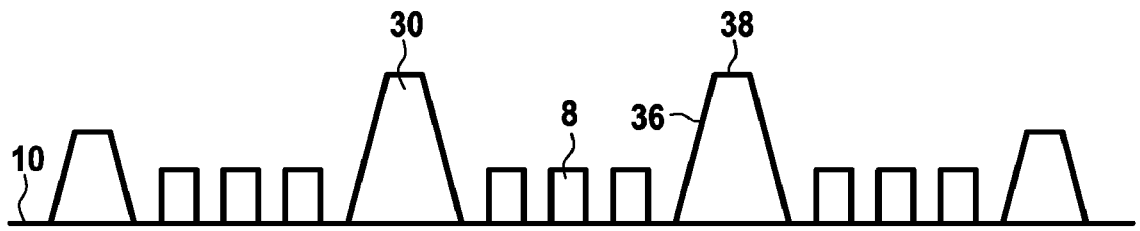
Figure 12:
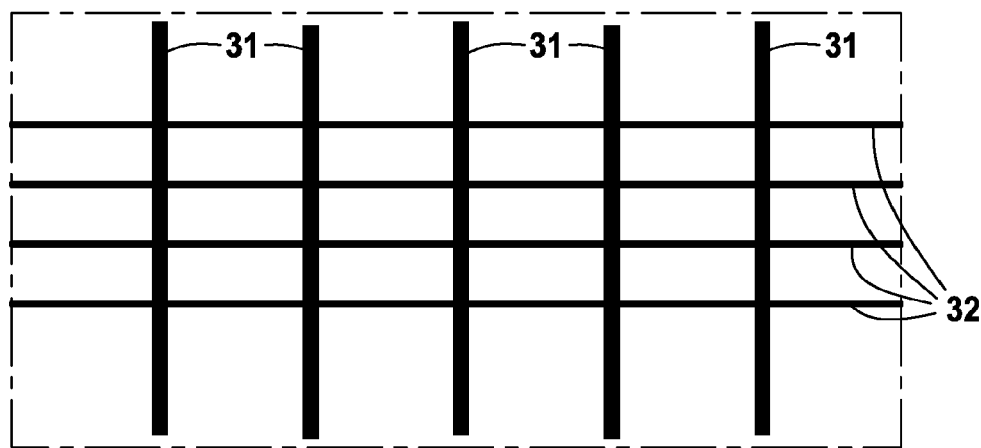
Figure 13:
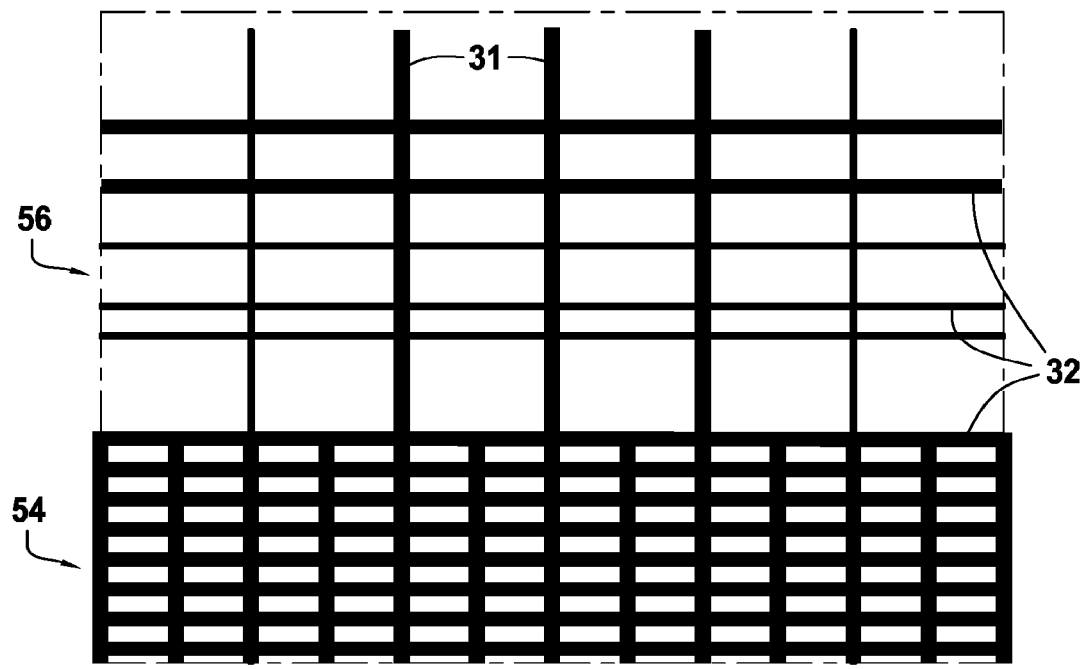

FIG. 11 illustrates an example of an arrangement of the separating walls, with the height of these walls decreasing from the center of the light source toward the edges; and FIGS. 12 and 13 illustrate schematic depictions, in a plan view of a light source, of the arrangement of the separating walls and of their respective heights in the context of achieving a first type of beam (FIG. 12) or a second type of beam (FIG. 13) at the output of the associated lighting device.

A lighting and/or signaling device for a motor vehicle includes a light source 1, in particular housed in a housing 2, which is closed by an outer lens 4 and defines an internal volume for receiving this emitting device. The light source is associated with an optic 6 for shaping a portion at least a portion of the light rays emitted by the semiconductor source. As was able to be explained previously, the shaping optic changes a direction of at least a portion of the light rays emitted by the source.

The light source 1 is a semiconductor source comprising light-emitting elements consisting, in particular in the case illustrated and as will be described hereinafter by way of example, of light-emitting rods of submillimeter size, that is to say three-dimensional semiconductor sources, as will be explained below, in contrast to conventional two-dimensional sources that can be equated to substantially planar sources on account of their thickness, of the order of a few nanometers, while a light-emitting rod source has a height equal to one micrometer at most.

The light source 1 comprises a plurality of light-emitting rods 8 of submillimeter size, which will hereinafter be termed light-emitting rods. These light-emitting rods 8 originate from one and the same carrier, and in particular a substrate 10 in the case of a light-emitting rod application. Each light-emitting rod, formed in this case using gallium nitride (GaN), extends perpendicularly, or substantially perpendicularly, projecting from the substrate, in this case produced from silicon, with other materials, such as silicon carbide, being able to be used without departing from the context of the invention. By way of example, the light-emitting rods could be produced from an alloy of aluminum nitride and of gallium nitride (AlGaN), or from an alloy of aluminum, of indium and of gallium (AlInGaN).

In FIG. 2, the substrate 10 has a lower face 12, to which a first electrode 14 is applied, and an upper face 16, from which the light-emitting rods 8 project and to which a second electrode 18 is applied. Various layers of material are stacked on the upper face 16, in particular after the light-emitting rods have grown from the substrate, achieved in this case by a bottom-up approach. Among these various layers may be found at least one layer of electrically conductive material, so as to allow the rods to be supplied with electric power. This layer is etched in such a way as to link any of the rods to one another, the turning-on of these rods then being able to be controlled simultaneously by a control module, not shown here. It may be provided that at least two light-emitting rods or at least two groups of light-emitting rods of the semiconductor light source 1 are arranged so as to be turned on separately by means of a turn-on control system.

The light-emitting rods of submillimeter size extend from the substrate and each include, as may be seen in FIG. 2, a core 19 made of gallium nitride, arranged around which are quantum wells 20 formed by a radial stacking of layers of different materials, in this case gallium nitride and gallium-indium nitride, and a shell 21, also made of gallium nitride, surrounding the quantum wells.

Each rod extends in a longitudinal axis 22 defining its height, the base 23 of each rod being arranged in a plane 24 of the upper face 16 of the substrate 10.

The light-emitting rods 8 of the semiconductor light source advantageously have the same shape. These rods are each delineated by an end face 26 and by a circumferential wall 28 that extends along the longitudinal axis. When the light-emitting rods are doped and subjected to polarization, the resulting light at the output of the semiconductor source is emitted mainly from the circumferential wall 28, it being understood that it may be provided that at least a small amount of light rays also exit from the end face 26. The result of this is that each rod acts as a single light-emitting diode, and that the density of the light-emitting diodes 8 improves the light output of this semiconductor source.

The circumferential wall 28 of a rod 8, corresponding to the gallium nitride shell, is covered with a layer of transparent conductive oxide (TCO) 29 that forms the anode of each rod, complementary to the cathode formed by the substrate. This circumferential wall 28 extends along the longitudinal axis 22 from the substrate 10 as far as the end face 26, the distance from the end face 26 to the upper face 16 of the substrate, from which the light-emitting rods 8 originate, defining the height of each rod. By way of example, it is provided that the height of a light-emitting rod 8 is between 1 and 10 micrometers, whereas is it provided that the largest transverse dimension of the end face, perpendicularly to the longitudinal axis 22 of the light-emitting rod in question, is less than 2 micrometers. It may also be provided to define the surface area of a rod, in a cross-sectional plane perpendicular to this longitudinal axis 22, to be within a range of defined values, and in particular between 1.96 and 4 square micrometers.

It is understood that, when forming the rods 8, the height may be modified from one light source to another in such a way as to boost the luminance of the semiconductor light source when the height is increased. The height of the rods may also be modified within a single light source, such that a group of rods may have a height, or heights, that are different from another group of rods, these two groups forming the semiconductor light source comprising light-emitting rods of submillimeter size.

The shape of the light-emitting rods 8 may also vary from one device to another, in particular in terms of the cross section of the rods and in terms of the shape of the end face 26. FIG. 2 illustrates light-emitting rods having a cylindrical general shape, and in particular with a polygonal cross section, more particularly hexagonal in this case. It is understood that it is important, for light to be able to be emitted through the circumferential wall, that the latter has a polygonal or circular shape, for example.

Moreover, the end face 26 may have a shape that is substantially planar and perpendicular to the circumferential wall, such that it extends substantially parallel to the upper face 16 of the substrate 10, as illustrated in FIG. 2, or else it may have a curved or pointed shape at its center, so as to multiply the directions in which the light exiting this end face is emitted, as illustrated in FIG. 3.

In FIG. 2, the light-emitting rods 8 are arranged in a two-dimensional matrix, with rods aligned in rows and in columns that are perpendicular with respect to one another. This arrangement could be such that the light-emitting rods are arranged in quincunx. The invention covers other distributions of the rods, in particular having rod densities that may vary from one light source to another, and that may vary in different zones of one and the same light source. FIG. 2 shows the distance d1 separating two immediately adjacent light-emitting rods in a first transverse direction and the distance d2 separating two immediately adjacent light-emitting rods in a second transverse direction. The separating distances d1 and d2 are measured between two longitudinal axes 22 of adjacent light-emitting rods. The number of light-emitting rods 8 projecting from the substrate 10 may vary from one device to another, in particular so as to increase the luminous density of the light source, but it is recognized that one or the other of the separating distances d1, d2 must be equal to 2 micrometers at least, in order that the light emitted by the circumferential wall 28 of each light-emitting rod 8 is able to exit the matrix of rods. Moreover, it is provided that these separating distances are not greater than 100 micrometers.

The substrate 10 also bears separating walls 30, which consist of opaque low walls arranged between the rods so as to define a physical separation of some of the rods with respect to one another. It is understood that the rods may thus be distributed in groups, on the one hand by selectively controlling the supply of power to each of the rods, and on the other hand by walls physically delineating rod installation zones and at least partially blocking the rays emitted by any group of rods.

A plurality of separating walls 30 is provided, projecting from the substrate 10, and the arrangement of said walls on said substrate may vary from one light source to another in relation to the lighting functions that it is desired to perform with this lighting and/or signaling device associated with this light source. Below will be described, in particular in connection with FIGS. 12 and 13, a number of practical cases of the arrangement of the walls, and the consequences on the beam emitted by the associated device. These separating walls 30 have the role of forming a cut-off in the light beam emitted by the light rays at the output of one or more rods that is/are directly adjacent to these separating walls.

In particular in a light source 1 in which the light-emitting rods 8 are arranged in a matrix of rows and columns (visible in FIG. 2), the separating walls 30 are low walls that extend substantially rectilinearly between the rows of rods. First walls 31 may extend, in this case, in a first direction and second walls 32 may extend in a second direction, substantially perpendicular to the first direction. In the example illustrated in FIG. 2, in order to leave the rods visible, a first wall 31 and a second wall 32 have been shown, it being understood that the source may advantageously include, projecting from the substrate 10, a plurality of first separating walls 31, substantially parallel to one another in the first direction, and a plurality of second separating walls 32, substantially parallel to one another in the second direction.

Figure 6:
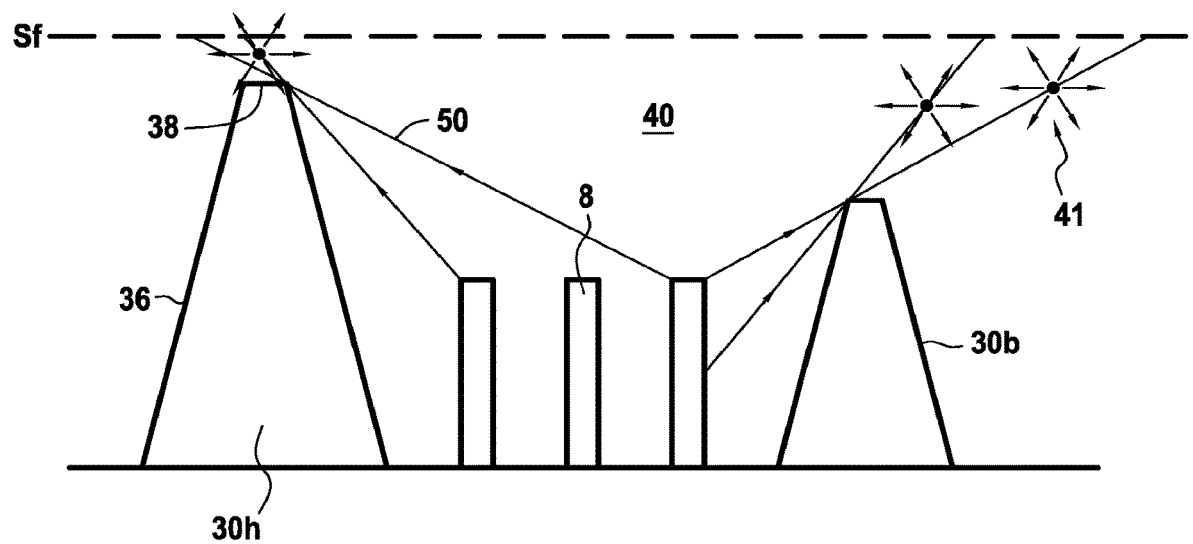
FIG. 6 is a schematic depiction of the concept illustrated in FIG. 5, with separating walls having trapezoidal shapes and a plurality of rods arranged between two separating walls, the assembly being illustrated in one particular embodiment in which a layer of material forms an encapsulant covering the rods and the walls entirely.
Figure 7:
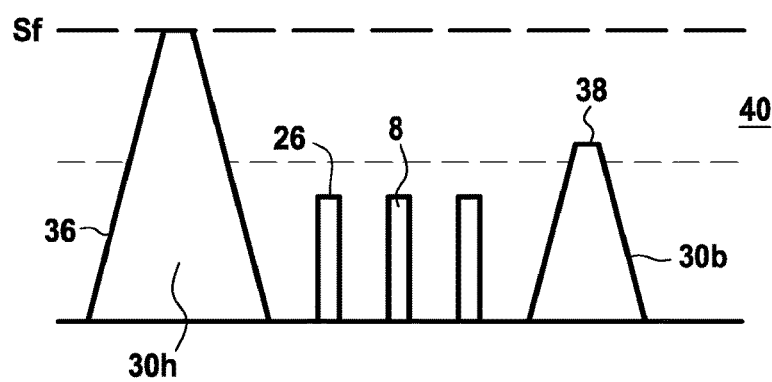
FIG. 7 is a depiction substantially similar to that in FIG. 6, illustrating in this case a variation in the height of a layer of material forming an encapsulant for the rods and the separating walls, which are only partially embedded in this case, in contrast to what is illustrated in FIG. 6.

It is understood that the spacing between the successive separating walls of one and the same series may be constant, with a defined number of rows of rods 8 arranged between these two successive walls 30, or else be different along the series, depending on the size of the groups of rods that it is desired to form and the corresponding lighting functions. A plurality of practical cases are illustrated, in particular with three rows of rods 8 arranged between two successive separating walls 30 (FIG. 6 and FIG. 7 for example, or else FIG. 11), or else a single row of rods 8 arranged between two successive separating walls (FIGS. 8 to 10 for example).

Each separating wall 30 includes lateral faces 36, which extend facing one or more rods 8 may adopt a plurality of separate shapes, and an upper face 38 at the free end of the wall opposite the substrate. It is understood that the separating walls illustrated in FIG. 5 in the form of rods are only theoretical implementations, and that they must have a minimum thickness in practice, their maximum thickness moreover being defined by the spacing between two rods separated by such a wall.

The separating walls consist of low walls projecting from the substrate, at least one of the lateral faces 36 of which may enable the absorption or the reflection of the light rays emitted by the rods of the group that the separating walls play a part in defining, by surrounding said rods at least partially. According to either one of the cases of absorption or reflection, the separating walls may be formed by resin or of metal, and may or may not have a reflective or diffusive or absorbent coating on the lateral face 36.

Figure 8:
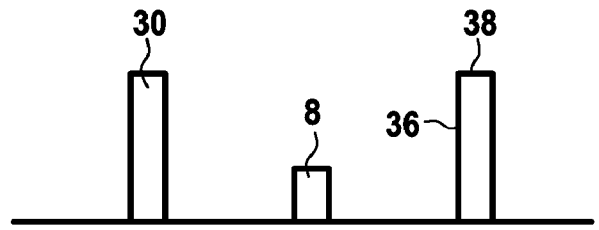
FIGS. 8 to 10 illustrate examples of the production of the separating walls, having a cross section that is substantially rectangular (FIG. 8), trapezoidal (FIG. 9), or with at least one face having a parabolic profile (FIG. 10)
Figure 9:
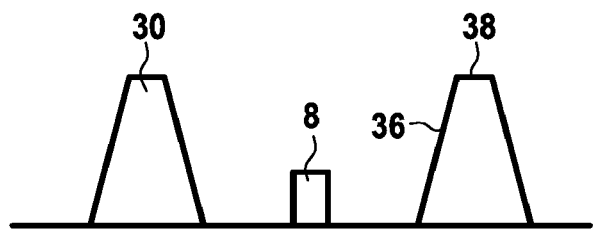
Figure 10:
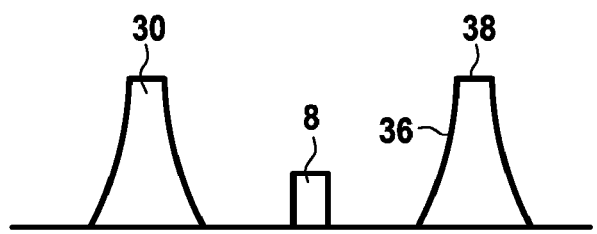

According to different production variants, the lateral faces 36 may have a straight shape, substantially perpendicular to the substrate, such that the separating wall has the shape of a rectilinear low wall with a substantially rectangular cross section, as illustrated in FIG. 8, or else the lateral faces may have a straight shape that is inclined with respect to the normal to the substrate, such that the corresponding separating wall has the shape of a low wall with a substantially trapezoidal cross section, as illustrated in FIG. 9, or else again the lateral faces may have a profile in the shape of a parabola, as illustrated in FIG. 10. In each of these cases, the upper face 38 is substantially parallel to the upper face 16 of the substrate 10.

The feature according to which the heights of the separating walls may vary from one wall to another will be described hereinafter, as will how this variable height plays a role in defining cut-off lines in the beam emitted at the output of the lighting and/or signaling device.

The light source 1 may furthermore include, as illustrated in particular in FIG. 3, a layer 40 of a polymeric material forming an encapsulant in which light-emitting rods 8 and separating walls 30 are at least partially embedded. The layer 40 may thus extend over the entire extent of the substrate, or only around a defined group of light-emitting rods 8. The polymeric material, which may in particular be silicone-based, makes it possible to protect the light-emitting rods 8 without impairing the diffusion of the light rays. Furthermore, it is possible to integrate, into this layer 40 of polymeric material, wavelength conversion means, for example phosphors 41, that are able to absorb at least a portion of the rays emitted by one of the rods and to convert at least part of said absorbed excitation light into a light emission having a wavelength that is different from that of the excitation light. It may indiscriminately be provided that the wavelength conversion means are embedded in the bulk of the polymeric material, or else that they are arranged on the surface of the layer of this polymeric material.

The light source may furthermore include a coating 42 of light-reflective material that is arranged between the light-emitting rods 8 so as to deflect the rays, which are initially oriented toward the substrate, toward the end face 26 of the light-emitting rods 8. In other words, the upper face 16 of the substrate 10 may include a reflective means that returns the light rays, which are initially oriented toward the upper face 16, toward the output face of the light source. Rays that would otherwise be lost are thus recovered. This coating 42 is arranged between the light-emitting rods 8 on the layer of transparent conductive oxide 29.

The light source 1 in this case has a rectangular shape, but it will be understood that it may have other general shapes, in particular a parallelogram shape, without departing from the context of the invention.

The shaping optic 6 may in particular comprise a lens 46 that deflects the rays emitted by the light source that is arranged at the object focal point of the lens so as to form a regulatory beam, that is to say a beam that complies with the photometry chart of any lighting beam, for example a low beam, a high beam or a daytime running light.

Regarding the light source, a group of rods is defined by its placement between at least two separating walls 30, the dimensions of this group furthermore being able to be defined by edges of the substrate forming the light source. Each group is configured to emit rays, the emission of which by the shaping optic creates a portion of the overall beam. When the rods in this group are turned off, a dark zone is produced in the projected beam, and a more or less sharp cut-off is sought depending on the location of this dark zone in the beam.

Figure 4:
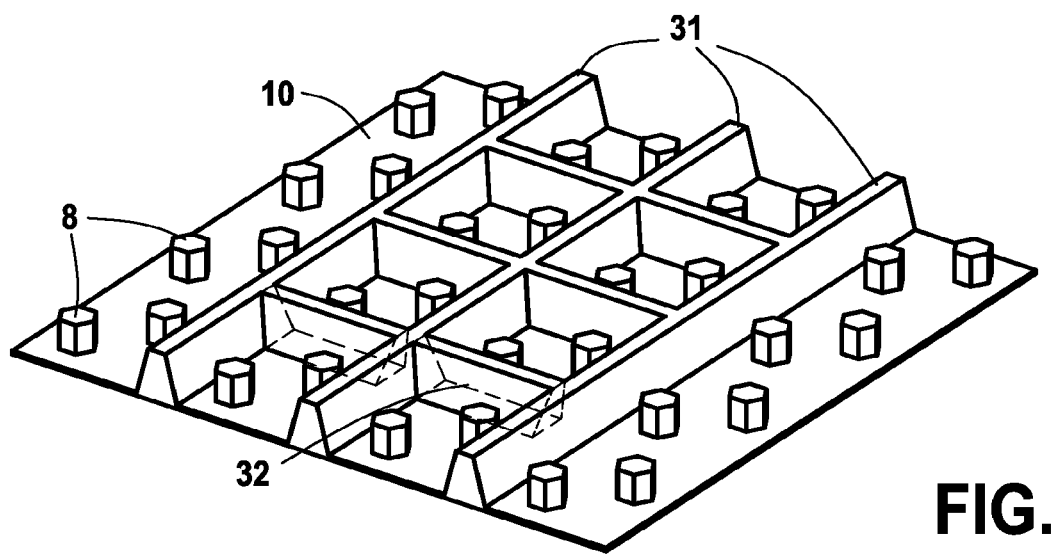
FIG. 4 is a schematic, perspective depiction of an arrangement of rods and of separating walls projecting from a substrate of a semiconductor light source according to the invention.

According to the invention, at least two separating walls 30 defining one and the same group of rods 8 have a different height from one another. In embodiments illustrated in FIGS. 2 and 4, these are at least one first separating wall 31 and one second separating wall 32, that is to say separating walls whose first and second directions of elongation are secant, that have different heights. And in embodiments illustrated in FIGS. 5 to 7, and in particular in FIG. 11, these are successive separating walls of one and the same series that have different heights. The technical effect of these various separating wall heights defining one and the same group of rods is to enable different degrees of cut-off sharpness.

Specifically, the sharpness of the cut-off of the beam portion created by the rays emitted by the group of rods that are surrounded by separating walls depends on the height of these separating walls and on the proximity of the end face of this wall to the object focal surface of the shaping optic. The closer the separating wall to this focal surface, the sharper the corresponding cut-off.

This is described with reference to the illustration of FIG. 5, in which it is to be noted that the separating walls are shown theoretically by a line.

A "high" separating wall 30*h* has a free end 38 substantially coincident with the focal surface Sf of the shaping optic of the lighting and/or signaling device, whereas a "low" separating wall 30*b* has a free end arranged set back from this focal surface Sf, that is to say that it extends between the focal surface Sf and the upper face of the substrate.

A first rod 8 emits first rays 50 (shown by single-arrow lines) from its circumferential wall 28, over the entire height of the latter. It will be understood that the rays may leave in any direction, and that only six first rays 50 leaving opposite the substrate have been shown so as to clarify the figure for the reader.

On the one side, the first rays are blocked by a "high" separating wall, and on the other, the rays are blocked by a "low" separating wall. It is understood that the first rays 50 that are oriented so as to pass beyond the high separating wall cross the focal surface Sf beforehand and thus remain in the luminous segment that is defined for this first rod between the separating walls. The same applies for the adjacent rod arranged on the other side of the "high" separating wall, such that the cut-off between the first rays 50 and the second rays 52 (shown by double-arrow lines) is sharp.

On the other side, the first rays 50 are blocked by a "low" separating wall, that is to say set back from the focal surface, and, as a result, the rays emitted by the rods intersect the focal surface beyond the space that is defined by the separating walls around the group of rods. As is illustrated, this results in first rays 50, emitted by the first rod, that pass into the luminous segment that is associated with the adjacent rod, and, in an analogous manner, second rays 52, emitted by an adjacent rod, pass into the luminous segment that is associated with the first rod (and shown by dotted lines). The cut-off between the segments is thus blurred.

Thus, by varying the height of the separating walls, a defocalization is created, that is to say a variation in the distance between the free end face, or upper face, of the separating wall and the focal surface of the shaping optic.

Figure 5:
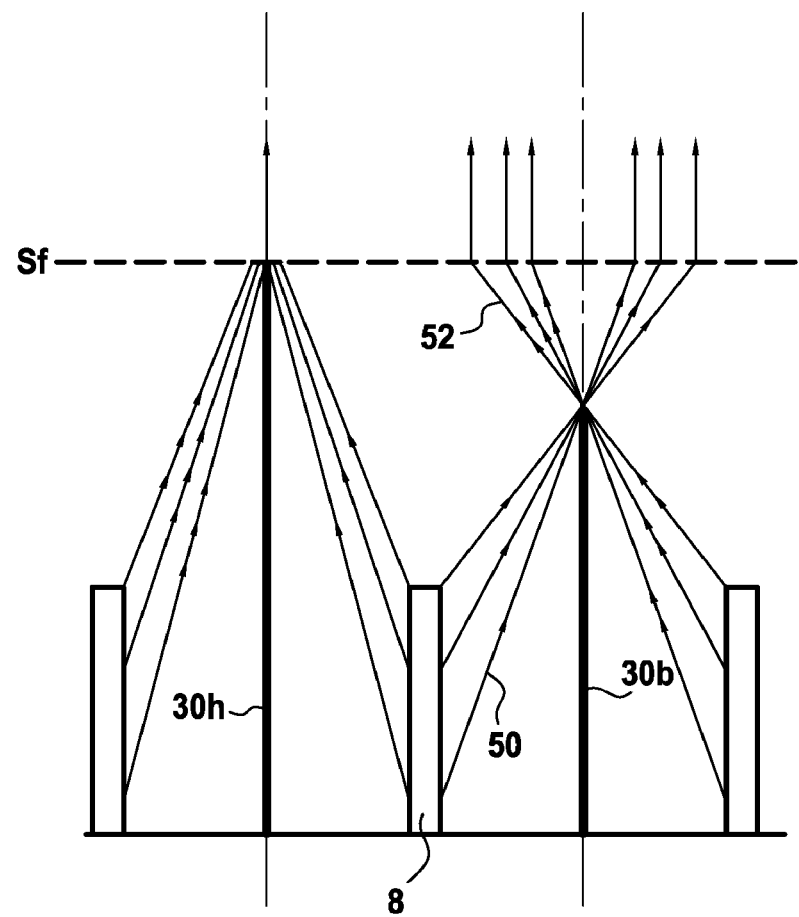
FIG. 5 is a schematic depiction of the concept of variable heights of the separating walls for achieving a more or less sharp contrast of the beams emitted by various light-emitting rods.

As illustrated in this FIG. 5, the focal surface Sf of the shaping optic 6 is adjusted to the free end face 38 of the separating wall 30 that extends highest, that is to say at the greatest distance from the substrate 10. This separating wall then plays a part in forming a sharp cut-off between the beams created by the groups of rods that it separates. The separating wall that has a different height and whose free end face therefore extends at a distance from the focal surface of the shaping optic plays a part in the formation of a blurred cut-off.

As has been described, a layer 40 of a polymeric material is advantageously arranged on the substrate so as to form an encapsulant in which light-emitting rods 8 and separating walls 30 are at least partially embedded, and this layer of polymeric material comprises wavelength conversion means, for example phosphors 41, that are able to absorb at least a portion of the rays emitted by one of the rods and to convert at least part of said absorbed excitation light into a light emission having a wavelength that is different from that of the excitation light. This encapsulant must extend, in terms of height, at least above the rods in order to protect them, and it may be provided, in some production variants, that it does not cover the separating walls entirely (FIG. 7) or, in contrast, that it is provided high enough, that is to say at a distance from the substrate, to cover the separating walls entirely (FIG. 6) and that, as a result, the focal surface of the shaping optic may be adjusted to the upper surface of the encapsulant, that is to say the surface opposite the substrate. In the latter case, it should be noted that the rays passing beyond a "low" separating wall 30b are diffused by the grains of phosphor forming the phosphor 41 over a higher or thick zone, thereby blurring the rays to a greater extent.

In the various figures described up to this point, mention has been made only of parallel separating walls 30. It is interesting to note that, in this context, as illustrated in FIG. 11, the height of the separating walls progresses, decreasing from the center of the light source toward the edges. Sharp cut-offs in the traffic corridor and more blurred cut-offs to the sides of the field of vision are thus achieved.

However, as was able to be explained previously, it is now necessary to ensure the sharpness of both vertical and horizontal cut-offs in one and the same beam. This is made possible, according to the invention, by producing secant separating walls having different heights.

Two particular arrangements of separating walls 30 projecting from a substrate 10 will now be described, wherein at least two walls according to the invention have different heights.

FIG. 12 illustrates a simple arrangement in which a first series of first separating walls 31 extends vertically, and in which a second series of second separating walls 32 extends horizontally. The first walls, forming vertical walls, have a height that is greater than the height of the second walls, forming horizontal walls, such that sharp cut-offs are generated between vertical segments, in order in particular to enable the production of a matrix beam in which dark strips may be created without reducing the luminous intensity on each side of these dark strips, and such that less sharp cut-offs are generated between horizontal strips. It is thus possible to meet the requirements for an ADB (adaptive driving beam) or a low beam, for example.

FIG. 13 illustrates a more complex arrangement, enabled by the invention without any major production difficulties, with the growth of the separating walls on the substrate being easily implementable and as technically simple as the growth of the rods on the substrate. The beam in this case has a bottom part 54 and a top part 56 that are distinguished in particular in that, in the bottom part 54, the separating walls are all high, that is to say that their end face is arranged substantially on the focal surface of the shaping optic. This bottom part 54 of the beam therefore has zones in the cut-offs that are relatively sharp, and an image resulting therefrom that is highly pixelated, such that this part may be associated with a road marking, for example.

The top part 56 of the beam includes separating walls of different height, with a series of first vertical walls 31 whose height varies from the center toward the edges of the light source, that is to say that the highest first vertical walls 31 are at the center of the light source. Cut-offs that are increasingly blurred toward the outside of the field of vision are thus made possible.

By contrast, in this top part, the second horizontal walls 32 are such that they have, in the vicinity of the bottom part 54, a height that is smaller than that of the first walls and smaller than those of the second walls of the bottom part, and in particular such that their end face is set back from the focal surface of the shaping optic, that is to say between this focal surface and the carrier from which the walls extend. It is thus sought to make the cut-offs more blurred, which is useful in particular for the "low beam" function, in the center of the driver's field of vision. Moreover, in an upper end part of the top part of the beam, the second horizontal walls 32 may revert to a greater height.

The present invention applies both to a front headlight and to a tail light of a motor vehicle. The above description clearly explains how the invention makes it possible to achieve the aims it set itself, and in particular to provide a lighting and/or signaling device that makes it possible to achieve, by applying separating walls of variable heights to a semiconductor source between the various light emitters, an improved management of the cut-offs between the portions of the emitted beam, with the possibility of varying the sharpness of these cut-offs depending on their position in the beam, in order to provide very sharp cut-offs in zones of the beam in which selective lighting is desired, that is to say lighting in which it is possible to darken a part of the beam so as not to dazzle other users, for example, and, on the other hand, blurred cut-offs, in particular at the periphery of the beam. As was able to be explained previously, it is possible to place separating walls between light-emitting elements, both on a substrate with emitting elements that are formed by light-emitting rods and with other types of light-emitting element projecting from a carrier, with the height of the separating walls being configured according to the principle of the invention, that is to say such that at least two separating walls defining one and the same group of emitters have a different height.

The invention claimed is:

1. A light source for a headlamp of a vehicle comprising:
a plurality of light emitters that are arranged on the surface of a carrier, and
a plurality of separating walls extending from the carrier and arranged between the light emitters in a way to define groups of emitters, the plurality of separating walls consisting of a first series of first separating walls and a second series of second separating walls, the first series extending vertically, the second series extending horizontally, the first separating walls having a first constant height, the second separating walls having a second constant height, and the first constant height being greater than the second constant height,
wherein a first group of emitters is activated separately from a second group of the emitters,
each separating wall has uniform lateral faces facing one or more light emitters of the plurality of light emitters, and
each separating wall is separating at least one light emitter from another light emitter, wherein
all the separating walls of the plurality of separating walls extending vertically have the same first constant height and all the separating walls of the plurality of separating walls extending horizontally have the same second constant height.

2. The light source according to claim 1, wherein the carrier is a substrate, the plurality of light emitters is a plurality of semiconductor light-emitting rods extending respectively from the substrate, and the plurality of separating walls extend from the substrate while being arranged between the rods in such a way as to define groups of rods, and such that at least two separating walls have different heights.

3. The light source according to claim 1, wherein at least one separating wall has a trapezoidal cross section.

4. The light source according to claim 2, wherein at least one separating wall has a face, facing one of the rods of the group that it plays a part in defining, that has a substantially parabolic profile.

5. The light source according to claim 2, wherein a layer of material forming an encapsulant is deposited on the substrate, at least partially covering the rods and the separating walls, the encapsulant extending at least as far as to cover the highest rod.

6. The light source according to claim 5, wherein the encapsulant contains a phosphor.

7. A lighting device comprising a light source according to claim 1 and an optic for shaping the light rays emitted by the light source.

8. The lighting device according to claim 7, wherein the different height of at least two separating walls causes a light beam having cut-offs of variable sharpness.

9. The lighting device according to claim 7, wherein a first series of separating walls extends substantially vertically facing the optic, whereas a second series of the separating walls extends substantially horizontally facing the optic.

10. The lighting device according to claim 7, wherein an encapsulant covers the entirety of the separating walls, a focal surface of the optic being substantially adjusted to coincide with the end surface of the encapsulant opposite the carrier.

11. The lighting device according to claim 7, wherein an encapsulant partially covers one or more separating walls, a focal surface of the optic being adjusted to coincide with the end face of the highest separating wall.

12. The lighting device according to claim 7, wherein the light source generates light rays that form at least part of a regulatory light beam for a motor vehicle.

13. The lighting device according to claim 7, wherein the optic includes a projecting optic.

14. The light source according to claim 2, wherein each semiconductor light-emitting rod has a hexagonal cross section.

15. A lighting device for a vehicle comprising:
a light source including
a plurality of light emitters that are arranged on a surface of a carrier, and
a plurality of separating walls extending from the carrier and arranged between the light emitters in a way to define groups of light emitters; and
an optic for shaping the light rays emitted by this light source, wherein the separating walls consist of low walls and high walls, wherein a free end of a high wall corresponds to a focal surface of the optic for shaping the light rays, and a free end of a low wall is below the focal surface, and wherein
all the high separating walls of the plurality of separating walls extend vertically and have a same first constant height and all the low separating walls of the plurality of separating walls extend horizontally and have a same second constant height.

16. A light source for a headlamp of a vehicle comprising:
a plurality of light emitters that are arranged on the surface of a carrier, and
a plurality of separating walls extending from the carrier and arranged between the light emitters in a way to define groups of light emitters,
wherein the separating walls in a bottom part of the light source have a constant height, and the separating walls in a top part of the light source have different height, the top part including a first series of separating walls extending in the vertical direction and a second series of separating walls extending in the horizontal direction, the first series of separating walls having a progressive height decreasing from the center of the light source toward at least one edge of the light source, and the second series of separating walls having a lower section and an upper section, the separating walls in the upper section having a height greater than the separating walls in the lower section, wherein
the separating walls in the lower section have a height lower than the constant height.

17. The light source according to claim 1, wherein the lateral faces of the separating walls have a straight shape perpendicular to the carrier.

18. The light source according to claim 1, wherein the lateral faces have a substantially parabolic profile and each separating wall has a uniform upper face parallel to the carrier.

19. The light source according to claim 1, wherein the upper surface of the carrier includes a reflective coating.

20. The light source according to claim 1, wherein the lateral faces have an absorbent coating or a reflective coating.

\* \* \* \* \*